(12) United States Patent
Uhlig et al.

(10) Patent No.: US 10,784,147 B2
(45) Date of Patent: Sep. 22, 2020

(54) METHOD FOR PRODUCING A BURIED CAVITY STRUCTURE

(71) Applicant: Infineon Technologies AG, Neubiberg (DE)

(72) Inventors: Ines Uhlig, Dresden (DE); Kerstin Kaemmer, Radebeul (DE); Norbert Thyssen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 16/029,237

(22) Filed: Jul. 6, 2018

(65) Prior Publication Data

US 2019/0027399 A1  Jan. 24, 2019

(30) Foreign Application Priority Data

Jul. 20, 2017 (DE) .................. 10 2017 212 437

(51) Int. Cl.
*H01L 21/762* (2006.01)
*H01L 21/768* (2006.01)
*H01L 21/3105* (2006.01)
H01L 21/306 (2006.01)
H01L 21/3065 (2006.01)

(52) U.S. Cl.
CPC .. *H01L 21/76281* (2013.01); *H01L 21/31056* (2013.01); *H01L 21/76205* (2013.01); *H01L 21/76267* (2013.01); *H01L 21/76865* (2013.01); H01L 21/3065 (2013.01); H01L 21/30604 (2013.01); H01L 21/30608 (2013.01)

(58) Field of Classification Search
CPC ........... H01L 21/7605; H01L 21/31056; H01L 21/76865; H01L 21/042; H01L 21/0475; H01L 21/74; H01L 21/0415; H01L 21/265; H01L 21/76267; H01L 21/3065; H01L 21/30604

See application file for complete search history.

(56) References Cited

U.S. PATENT DOCUMENTS

| 4,888,300 A | 12/1989 | Burton |
| 5,232,866 A | 8/1993 | Beyer et al. |
| 2007/0281488 A1* | 12/2007 | Wells ................. H01L 21/3065 438/705 |

(Continued)

FOREIGN PATENT DOCUMENTS

| EP | 0269349 A2 | 6/1988 |
| WO | 91013463 A1 | 9/1991 |
| WO | 0048245 A1 | 8/2000 |

*Primary Examiner* — Thanhha S Pham
(74) *Attorney, Agent, or Firm* — Slater Matsil, LLP

(57) ABSTRACT

In accordance with an embodiment, a method for producing a buried cavity structure includes providing a mono-crystalline semiconductor substrate, producing a doped volume region in the mono-crystalline semiconductor substrate, wherein the doped volume region has an increased etching rate for a first etchant by comparison with an adjoining, undoped or more lightly doped material of the monocrystalline semiconductor substrate, forming an access opening to the doped volume region, and removing the doped semiconductor material in the doped volume region using the first etchant through the access opening to obtain the buried cavity structure.

22 Claims, 4 Drawing Sheets

(56) References Cited

U.S. PATENT DOCUMENTS

2010/0301448 A1* 12/2010 Kwon ............... H01L 21/76267
                                                  257/507
2011/0049622 A1   3/2011 Kitahara
2014/0110805 A1   4/2014 Kautzsch

* cited by examiner

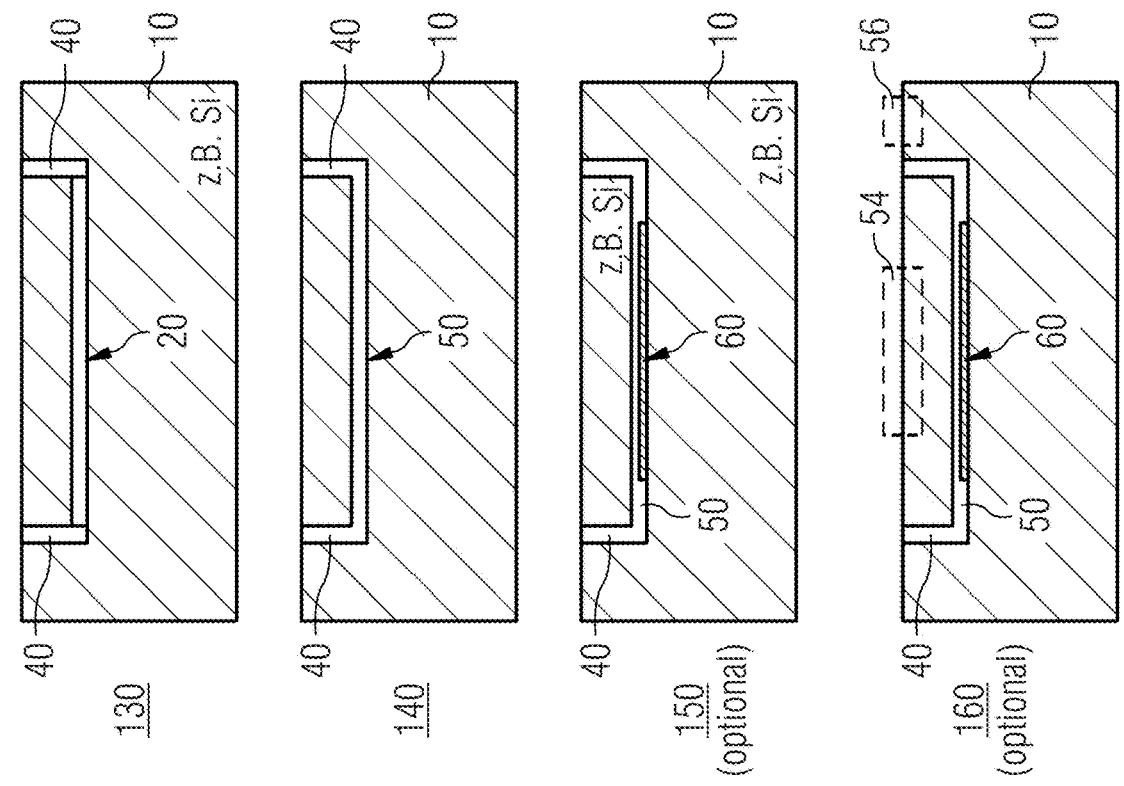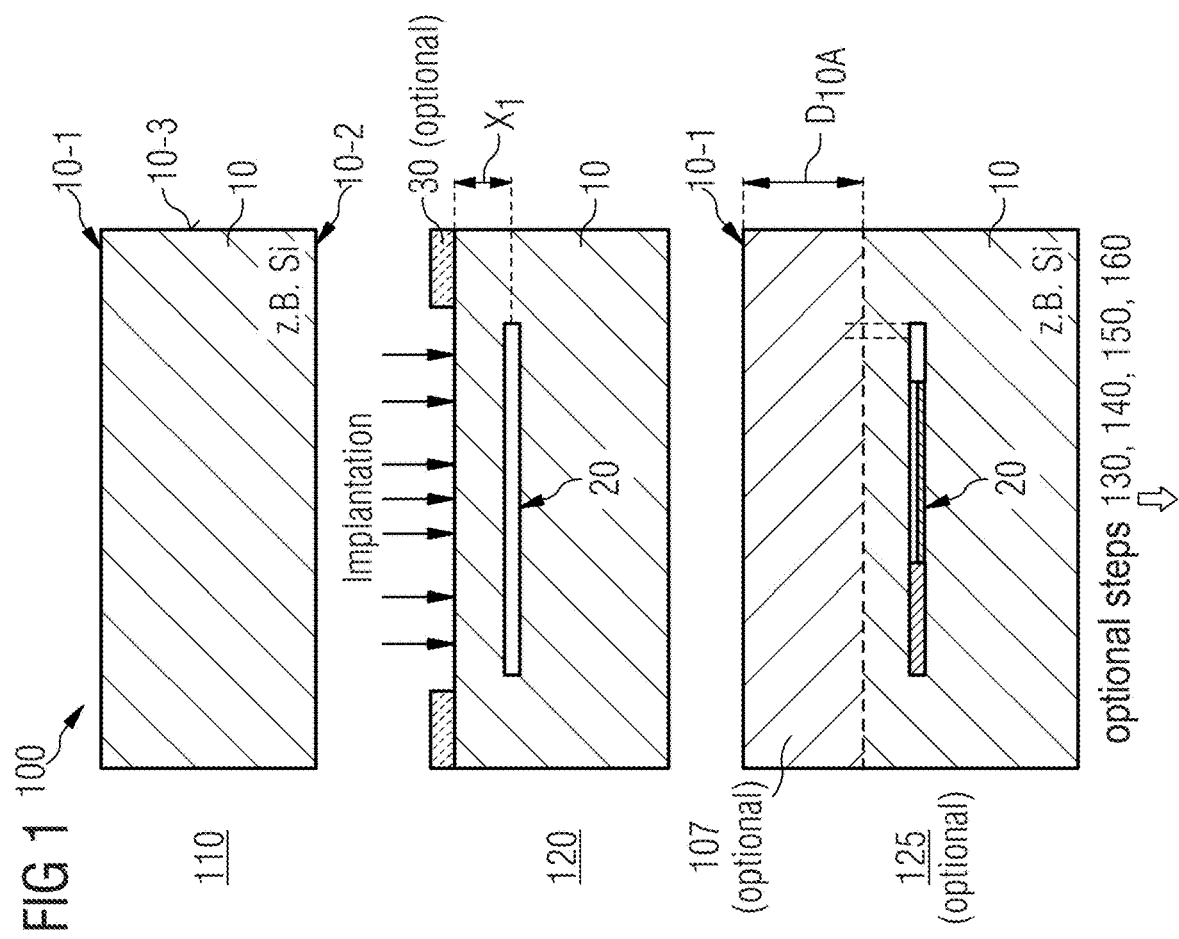

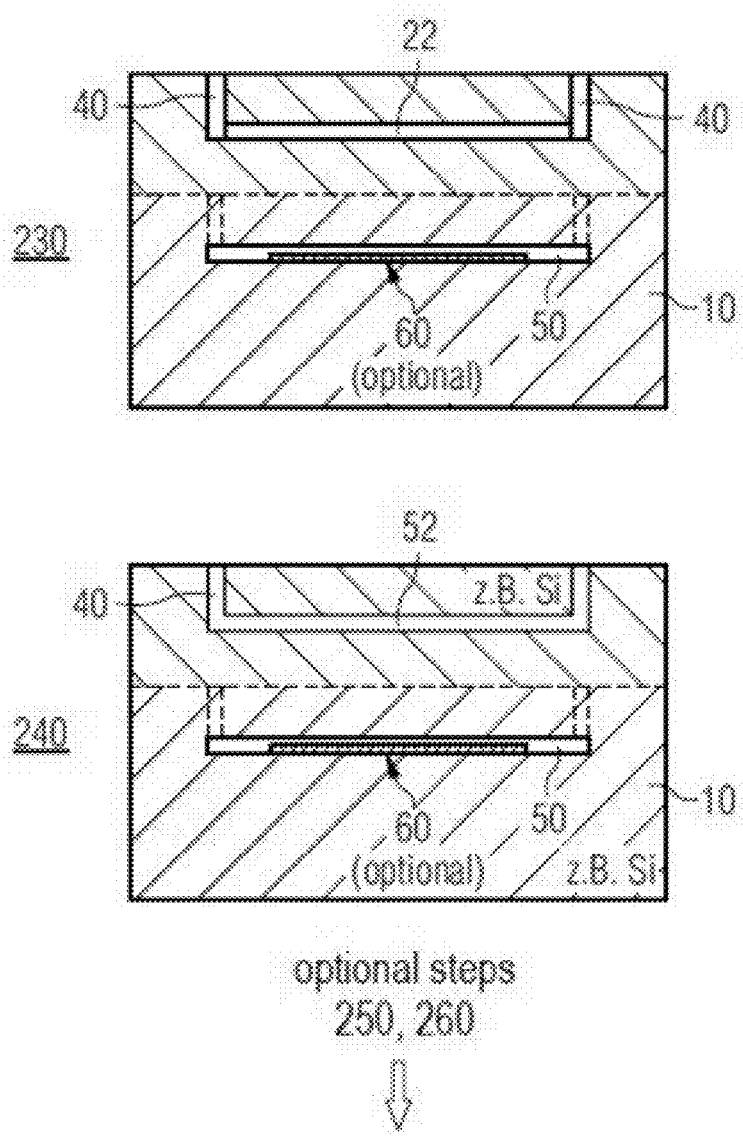

FIG 2C
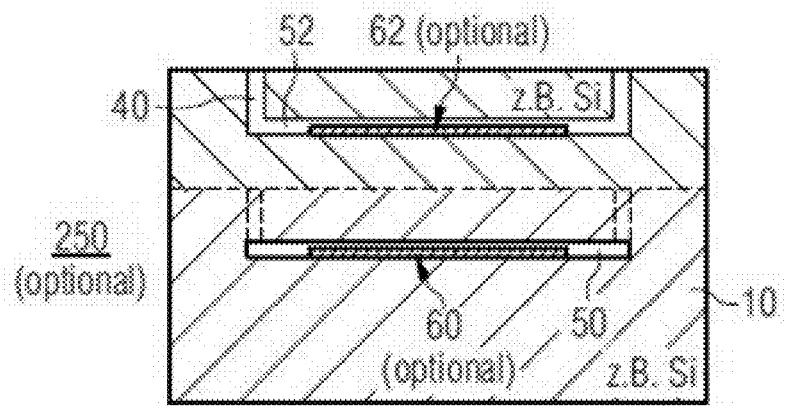
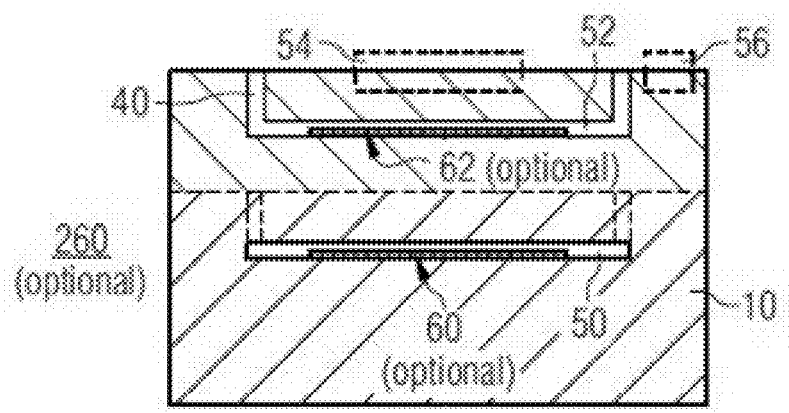

METHOD FOR PRODUCING A BURIED CAVITY STRUCTURE

This application claims the benefit of German Application No. 102017212437.7, filed on Jul. 20, 2017, which application is hereby incorporated herein by reference in its entirety.

TECHNICAL FIELD

Exemplary embodiments relate to a concept for processing a semiconductor substrate, and in particular to a concept for producing a buried cavity structure in a monocrystalline semiconductor substrate.

BACKGROUND

During the production of sensors on a basic material carrier, such as e.g. a silicon wafer, an electrical and/or mechanical decoupling of different regions of the basic material carrier is often required in order to ensure a correct functionality of the sensor elements arranged on the basic material carrier. The problem of a necessary decoupling is also present for example during a monolithic integration of different functional elements or semiconductor structures on the same basic material carrier, such as e.g. in the case of a MEMS sensor (MEMS=microelectromechanical system) comprising an ASIC control chip (ASIC=Application Specific Integrated Circuit).

Mechanical and electrical decouplings of different regions of a basic material carrier have hitherto been obtained for example by carrying out a process of locally etching through or separating the basic material. Furthermore, it is also possible to realize a local or whole area thinning of the basic material for the purpose of a decoupling. A further known realization of decoupling is to produce local cavities in a basic material carrier by means of a complex and thus cost intensive "Venezia process" or SON process (SON=silicon on nothing). Very high process temperatures are required for the Venezia approach, however, and so the process steps required therefor can be carried out only at the beginning of the process chain, since functional elements integrated on the basic material carrier later are often no longer permitted to be subjected to such a thermal loading. A further disadvantage of the Venezia process is "sagging" of local silicon surface regions. Therefore, the Venezia approach requires subsequent CMP process steps (CMP=Chemical Mechanical Polishing), wherein such CMP steps can impair or even destroy filigree structures in the basic material carrier.

Alternatively, by way of example, relatively complex silicon rear side etching processes or the use of stacked and structured SOI wafers (SOI=Silicon on Insulator) are/is used for providing a necessary decoupling.

To summarize, it can thus be stated that the decoupling concepts currently used are cost intensive, are not freely positionable owing to the thermal budget and can be applied with little flexibility in terms of use and implementation. The multiple integration of a wide variety of functional blocks on the same basic material carrier can thus be realized only to a limited extent and highly selectively.

SUMMARY

Exemplary embodiments relate to a method for producing a buried cavity structure, comprising the following steps: providing a monocrystalline semiconductor substrate, producing a doped volume region in the monocrystalline semiconductor substrate by means of a dopant implantation, wherein the doped volume region has an increased etching rate for a first etchant by comparison with the adjoining, undoped or more lightly doped material of the monocrystalline semiconductor substrate, forming an access opening to the doped volume region, and removing the doped semiconductor material in the doped volume region using the first etchant through the access opening in order to obtain the buried cavity structure.

Exemplary embodiments furthermore relate to a method in which after removing the doped semiconductor material in the doped volume region in the monocrystalline semiconductor substrate, a step of epitaxially depositing a monocrystalline semiconductor layer on the first main surface region of the monocrystalline semiconductor substrate is carried out in order to obtain an increase in thickness with an additional monocrystalline semiconductor material at the first main surface region of the monocrystalline semiconductor substrate. A further buried cavity structure is then produced in the resulting monocrystalline semiconductor substrate, by means of the following steps: producing a further doped volume region in the epitaxially deposited monocrystalline semiconductor substrate material by means of a further dopant implantation, wherein the further doped volume region has for the first etchant an increased etching rate by comparison with the adjoining, undoped or more lightly doped material of the monocrystalline semiconductor substrate, opening an access opening to the further doped volume region, and removing the doped semiconductor material in the further doped volume region using the first etchant through the access opening in order to obtain the further buried cavity structure in the resulting monocrystalline semiconductor substrate.

Exemplary embodiments thus relate to the combination of an implantation of a doped volume region within the monocrystalline semiconductor substrate, e.g. a monocrystalline silicon substrate, and a subsequent process of etching the material of the monocrystalline semiconductor substrate that has been doped by means of implantation. In the doped region, an increase in the local etching rate of the semiconductor material, e.g. silicon, is effected, such that these regions doped by means of implantation can be removed wet or dry chemically via access openings or contact connections in order thus to form cavities or buried cavity structures in the monocrystalline semiconductor substrate.

BRIEF DESCRIPTION OF THE DRAWINGS

Some exemplary embodiments of devices and/or methods are described in greater detail below by way of example with reference to the accompanying figures, in which:

FIG. 1 shows a basic flow diagram of a method for producing a buried cavity structure in accordance with one exemplary embodiment; and FIGS. 2A, 2B and 2C show a basic flow diagram of a method for producing buried cavity structures in accordance with one exemplary embodiment.

DETAILED DESCRIPTION OF ILLUSTRATIVE EMBODIMENTS

Figure 2A:
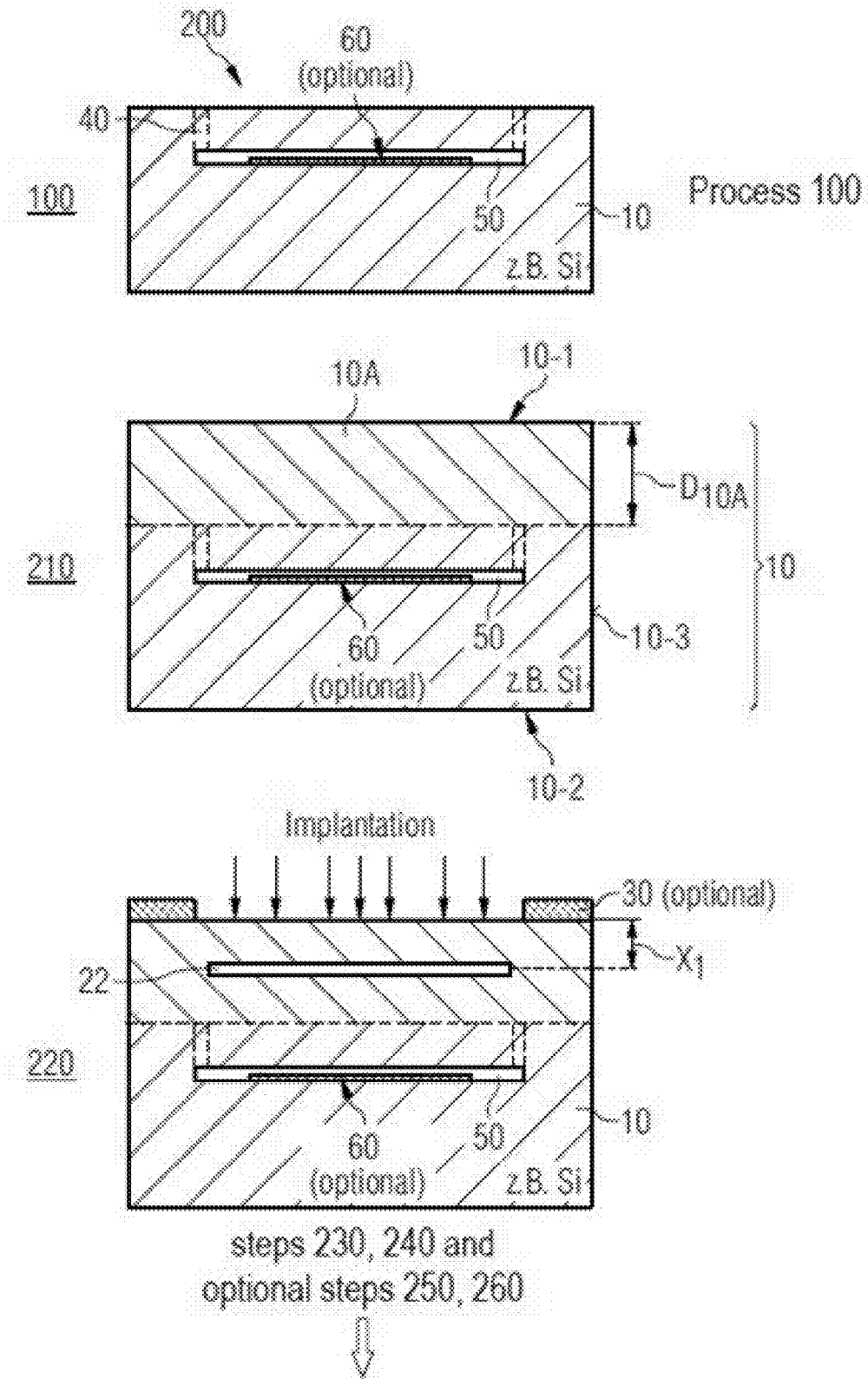

Before exemplary embodiments of the present invention are explained more specifically below in detail with reference to the drawings, it is pointed out that identical functionally equivalent or identically acting elements, objects, functional blocks and/or method steps are provided with the same reference signs in the various figures, such that the description of these elements, objects, functional blocks and/or method steps (having the same reference signs) as presented in various exemplary embodiments is mutually interchangeable or can be applied to one another.

Some embodiments described herein are directed to systems and methods by which an effective electrical and/or mechanical decoupling of different regions of a basic material carrier, such as e.g. a silicon wafer, is positionable very specifically. Thus, embodiment production methods may realized in a cost-effective, process compatible manner.

A basic flow diagram of a method 100 for producing a buried cavity structure in accordance with one exemplary embodiment will now be explained below with reference to FIG. 1.

In step 110, firstly a monocrystalline semiconductor substrate 10 is provided. The mono-crystalline semiconductor substrate can comprise as semiconductor material, for example, a monocrystalline silicon (Si), gallium nitride (GaN), silicon carbide (SiC) or else other suitable monocrystalline semiconductor materials. The semiconductor substrate 10 comprises for example a first main surface region or a front side 10-1, a second main surface region or a rear side 10-2 and a side surface region or a side surface 10-3 connecting the first and second main surface regions 10-1, 10-2.

In step 120, a doped volume region 20 is produced in the monocrystalline semiconductor substrate 10, e.g. at a distance x1 from the first main surface region 101 of the monocrystalline semiconductor substrate, by means of a dopant implantation, wherein the doped volume region 20 has for a first etchant an increased etching rate by comparison with the undoped or more lightly doped material of the monocrystalline semiconductor substrate 10 that adjoins the doped volume region 20. The doped volume region 20 in the monocrystalline semiconductor substrate 10 can be implemented for example by means of an ion implantation through an optional doping mask 30, wherein the doping mask 30 for example can be applied on the first main surface region 10-1 of the monocrystalline semiconductor substrate 10 before the implantation process (not explicitly shown in FIG. 1) and can be removed again from the first main surface region 10-1 of the monocrystalline semiconductor substrate 10 after the implantation process (not explicitly shown in FIG. 1).

Optionally, after producing 120 the doped volume region 20 with the doped semiconductor material in the monocrystalline semiconductor substrate 10, the monocrystalline semiconductor substrate 10 can furthermore be heat treated, i.e. subjected to a thermal treatment or an anneal in order to crystalize out at least the doped volume region 20 or else the entire monocrystalline semiconductor substrate 10.

In the method 100 in FIG. 1, furthermore optionally after the above thermal treatment and for example before forming (130) an access opening (40) to the doped volume region (20), a further monocrystalline semiconductor material or a monocrystalline semiconductor layer 10A can be applied on the first main surface 10-1 of the monocrystalline semiconductor substrate 10, for example by epitaxial deposition. An increase in thickness $D_{10A}$ with a further monocrystalline semiconductor material at the first main surface region 10-1 of the monocrystalline semiconductor substrate 10 is achieved as a result. The increase in thickness $D_{10A}$ in the form of the epitaxially deposited material thickness can be for example in a range of 0.1 μm to 100 μm, of 0.5-50 μm or of 1 μm-30 μm for this additional material layer. The monocrystalline semiconductor substrate 10 thus has the further monocrystalline semiconductor layer 10A.

In step 130, an access opening 40 to the doped volume region 20 is then formed or opened. Forming the access opening 40 to the doped volume region 20 is effected through the monocrystalline semiconductor substrate 10 or through the monocrystalline semiconductor substrate 10 provided with the further monocrystalline semiconductor material.

In step 140, the doped semiconductor material in the doped volume region 20 is then removed using the first etchant through the access opening 40 in order to obtain the buried cavity structure 50 in the monocrystalline semiconductor substrate 10.

In the process of producing 120 the doped volume region 20 e.g. by means of an ion implantation process, for example the implantation dose, i.e. the implantation duration and the implantation energy, is then chosen so as to obtain a doping profile having a doping maximum at a target depth x1 for the buried cavity structure 50 in the monocrystalline semiconductor substrate 10. The target depth can be at a distance or a depth of 0.01 to 30 μm, of 0.02 to 20 μm, of 0.05 to 10 μm or of (approximately) 1 to 5 μm, from the front side 10-1 of the monocrystalline semiconductor substrate 10.

Furthermore, the dopant concentration in the doped volume region 20 of the monocrystalline semiconductor substrate 10 can be chosen by means of the dopant implantation process so as to obtain for the first etchant a sufficient etching selectivity of the doped semiconductor material in the doped volume region in relation to the adjoining, undoped or more lightly doped semiconductor material of the monocrystalline semiconductor substrate 10. Typical dopings can be in a range of at least $10^{17}$ or at least $10^{18}$ cm$^{-3}$ to approximately $10^{22At}$/cm$^{-3}$.

Phosphorus, for example, can be used as dopant in order to obtain a phosphorus doped silicon material in the doped volume region 20 of the monocrystalline semiconductor substrate 10. Alternative dopants can comprise aluminum, antimony, arsenic, boron, gallium, germanium, indium, carbon or nitrogen, etc., wherein the enumeration of dopants presented should not be regarded as exhaustive, but rather merely as by way of example.

In accordance with a further exemplary embodiment, oxygen $O_x$, for example, can also be used as dopant in order to obtain the buried, doped volume region 20 comprising a silicon oxide material $SiO_x$. As soon as for example the buried cavity structure 50 has been obtained in the monocrystalline semiconductor substrate 10, the buried cavity structure 50 can furthermore be "expanded" by the surface region of the buried cavity structure obtained being oxidized and the silicon oxide material obtained subsequently being etched back in order to obtain a material removal within the buried cavity structure. This sequence of oxidizing and etching back in the buried cavity structure can be carried out or repeated as often as until a desired total material removal and hence the desired size of the buried cavity structure 50 is achieved.

Optionally, after producing 120 the doped volume region 20 comprising the doped semiconductor material in the monocrystalline semiconductor substrate 10, the monocrystalline semiconductor substrate 10 can furthermore be heat treated, i.e. subjected to a thermal treatment or an anneal, in order to crystalize out at least the doped volume region 20. During an ion implantation, impurity atoms in the form of ions are introduced into the substrate material as dopant or doping. Since "radiation damage" arises in the crystal lattice of the semiconductor material during the ion implantation generally depending on the mass of the implanted ions and the implantation dose, the semiconductor substrate 10 can be annealed after the implantation step. This is done by means of a high temperature process, for example, in which the impurity atoms are incorporated into the crystal lattice of the semiconductor material and the lattice structure is substantially reestablished. The annealing process can be realized for example by means of a furnace process or an RTA process (RTA=Rapid Thermal Annealing).

Step 130 of opening or forming the access opening 40 to the doped volume region 20 in the monocrystalline semiconductor substrate 10 can also be carried out by doping by means of ion implantation for example, a columnar volume region corresponding to the desired access opening 40 between the doped semiconductor region or volume region 20 and a main surface region, e.g. the front side 10-1, rear side 10-2 or side surface 10-3, of the monocrystalline semiconductor substrate 10. In this case, this is also referred to, for example, as a column implantation for a columnar access opening 40. The access opening 40 to the doped volume region 30 can then in turn be formed for example by means of an etching process.

In this regard, in accordance with one exemplary embodiment, the doped semiconductor material of the access opening 40 to the doped volume region 20 and also the semiconductor material of the doped volume region 20 can be removed using the same, i.e. the first, etchant.

In accordance with a further exemplary embodiment, a second etchant can be used in the step of forming or etching 130 the access opening 40, wherein the doped volume region 20 of the monocrystalline semiconductor substrate 10 can then be effective for example as an etch stop layer for the second etchant. Afterward, the first etchant is then used for etching free the doped volume region 20 in the monocrystalline semiconductor substrate 10 through the access opening 40.

Some exemplary etchants for the process of etching the doped volume region 20 and also the access opening 40 are presented below, wherein the enumeration of etchants presented should not be regarded as exhaustive, but rather merely as by way of example. Furthermore, the respective process of etching the doped volume region 20 and the access opening(s) 40 to the doped volume region 20 can be carried out for example by means of a wet etching process or else by means of a plasma etching process.

Plasma etching denotes for example a material removing, plasma assisted dry etching method in which the generally isotropic material removal, which is also highly material selective on account of the chemical character, i.e. the etching, is effected by means of a chemical reaction.

(Wet) etchants present in the liquid phase are used in a wet chemical etching process, wherein the material removal is effected by means of a chemical reaction of the etchant with the material to be removed.

By way of example, the following materials or precursors can be used as first and respectively second etchant.

For a doped silicon material in the access opening 40 (to be formed) and in the doped volume region 20 of the monocrystalline semiconductor substrate 10, the following etchants, for example, can be used as first etchant:

In a wet etching process: $HNO_3+HF$, KOH, EDP or TMAH

In a plasma etching process: $SF_6$, $NF_3$, $Cl_2$ or $CF_4$.

For a silicon oxide material in the access opening 40 (to be formed) and in the doped volume region 20 of the monocrystalline semiconductor substrate 10, the following etchants, for example, can be used as first etchant:

In a wet etching process: HF, BOE or $NH_4F$

In a plasma etching process: CxFy, e.g. $C_4F_8$, $C_5F_8$, $C_4F_6$ or $CHF_3$.

The following etchants, for example, can be used as second etchant in the step of forming or etching 130 the access opening 40, wherein the doped volume region 30 of the monocrystalline semiconductor substrate 10 can then be effective for example as an etch stop layer for the second etchant.

In a plasma etching process in silicon: $SF_6$, $NF_3$, $Cl_2$ or $CF_4$

As is illustrated in step 120 in FIG. 1, a continuous doped volume region 20 can be produced in the monocrystalline semiconductor substrate 10. It is equally possible to produce a plurality of doped volume regions (not explicitly shown in FIG. 1) spaced apart laterally and arranged e.g. parallel to the first main surface region 10-1 by means of a corresponding structuring of the doping mask 30 in the monocrystalline semiconductor substrate 10. Accordingly, in step 130, it is possible to produce respectively at least one access opening 40 to the differently doped volume regions 20 in the monocrystalline semiconductor substrate 10 in order then to remove the doped semiconductor material in the doped volume regions using the first etchant through said access openings 40 in order to produce a plurality of buried cavity structures 50 lying in one plane, for example, in the monocrystalline semiconductor substrate 10.

In accordance with exemplary embodiments, the buried cavity structure 50 obtained in step 140 of removing the doped semiconductor material in the doped volume region 20 can thus be maintained as an unfilled cavity which can be effective for example for mechanical and/or electrical decoupling or stress decoupling or else as a fluid line (gas pipeline).

In an optional step 150 in FIG. 1, a functional element or a functional structure 60 can then furthermore be introduced in the buried cavity structure or cavity 50, wherein introducing 150 the functional element involves depositing e.g. conformally in the buried cavity structure 50 a layer or a layer sequence, e.g. by means of an ALD process (ALD=atomic layer deposition) and/or a CVD process (CVD=chemical vapor deposition) or some other suitable layer applying process. By applying a plurality of layers for the functional element 60, by way of example a layer stack composed of different materials can be obtained as the functional element 60, said layer stack at least partly or else completely filling the buried cavity. The functional element or the functional structure 60 can have an optical, electrical, electromagnetic, magnetic, etc. functionality or property.

Furthermore, it is possible, as described above, by means of various layer applying processes, to form one or more functional elements or functional structures 60 in the buried cavity structure 50 obtained or the buried cavity structures 50 obtained. The cavity 50 can thus be at least partly or completely filled with different materials. The functional element 60 can become effective for example as a buried reflector by a material having a high reflection index being applied in the buried cavity structure 50. Furthermore, buried metal contact lines or other electrical elements can be produced as the functional element 60 by means of corresponding layer applying processes in the buried cavity structure 50.

In an optional step 160 in FIG. 1, a MEMS component 54 can then furthermore be formed in the monocrystalline semiconductor substrate 10 for example adjoining the first main surface region 10-1 above (relative to a perpendicular projection from the front side into the semiconductor substrate) the buried cavity structure(s) 50, said MEMS component being electrically and/or mechanically decoupled sufficiently well from the rest of the semiconductor material of the monocrystalline semiconductor substrate 10. Furthermore, at the front side 10-1 of the monocrystalline semiconductor substrate 10 which is not situated above (relative to a perpendicular projection from the front side into the semiconductor substrate) the buried cavity structure(s) 50, it is possible to form a circuit arrangement or ASIC 56 which is in electrical contact e.g. with the MEMS component and/or the functional element 60 in order to read from and/or drive the MEMS component and/or the functional element 60.

The optional step 160 can be carried out for example at any desired point in time in the process sequence of the method 100 after step 120 of producing the doped volume region 20 in the monocrystalline semiconductor substrate 10.

A further method 200 for producing one or more further buried cavity structures 52 in accordance with one exemplary embodiment will now be described below with reference to FIGS. 2A, 2B, and 2C.

In the method 200, firstly the method 100 described with reference to FIG. 1 for producing a buried cavity structure 50 in a monocrystalline semiconductor substrate 10 is carried out, as was described above with reference to FIG. 1. The above description of the method 100 comprising steps 110, 120, 130, 140 and optionally step 150, 160 is thus completely applicable to the production method 200 illustrated in FIGS. 2A, 2B, and 2C.

In the method 200 in FIGS. 2A, 2B, and 2C, after removing the doped semiconductor material in the doped volume region 20 in the monocrystalline semiconductor substrate 10 (corresponding to the method 100 in FIG. 1) in a subsequent step 210 a monocrystalline semiconductor layer 10A is applied on the first main surface 10-1 of the monocrystalline semiconductor substrate, for example by epitaxial deposition. An increase in thickness $D_{10A}$ with a further monocrystalline semiconductor material at the first main surface region 10-1 of the monocrystalline semiconductor substrate 10 is achieved as a result. The increase in thickness $D_{10A}$ in the form of the thickness of the epitaxially deposited material can be for example in a range of 0.1 μm to 100 μm, of 0.5 μm-50 μm or of 1 μm-30 μm for the additional material layer.

The monocrystalline semiconductor substrate 10 having the buried cavity structure(s) 50 is provided e.g. with the further monocrystalline semiconductor layer 10A. A further buried cavity structure 52 can be produced in the resulting monocrystalline semiconductor substrate 10, by means of step 210 of producing a further doped volume region 22 in the epitaxially deposited monocrystalline semiconductor substrate, wherein the further doped volume region 22 has for the first etchant an increased etching rate by comparison with the adjoining, undoped or more lightly doped material of the monocrystalline semiconductor substrate 10, by means of a step 230 of opening or forming an access opening 40 to the further doped volume region 22, and by means of a step 240 of removing the doped semiconductor material in the further doped volume region 22 using the first etchant through the access opening 40 in order to obtain the further buried cavity structure 52 in the resulting monocrystalline semiconductor substrate 10.

The above description of the method 100 comprising steps 110, 120, 130, 140 is thus correspondingly applicable to the production method 200 comprising steps 210, 220, 230, 240 illustrated in FIGS. 2A and 2B.

In step 210, firstly the monocrystalline semiconductor substrate 10 additionally having the epitaxially deposited semiconductor layer 10A is provided. The resulting semiconductor substrate 10 has the first main surface region or the front side 10-1, the second main surface region or the rear side 10-2 and the side surface region or the side surface 10-3.

In step 220, a doped volume region 20 is produced in the epitaxially deposited semiconductor layer 10A of the monocrystalline semiconductor substrate 10, e.g. at a distance x1 from the first main surface region 10-1, by means of a dopant implantation, wherein the doped volume region 22 has for a first etchant an increased etching rate by comparison with the undoped or more lightly doped material of the monocrystalline semiconductor substrate 10 that adjoins the doped volume region 22. The doped volume region 22 in the monocrystalline semiconductor substrate 10 can be implemented for example by means of an ion implantation through an optional doping mask 30, wherein the doping mask 30 for example can be applied on the first main surface region 10-1 of the monocrystalline semiconductor substrate 10 before the implantation process (not explicitly shown in FIGS. 2A, 2B, and 2C) and can be removed again from the first main surface region 101 of the monocrystalline semiconductor substrate 10 after the implantation process (not explicitly shown in FIGS. 2A, 2B, and 2C).

In step 230, an access opening 40 to the doped volume region 22 is then formed.

In step 240, the doped semiconductor material in the doped volume region 22 is then removed using the first etchant through the access opening 40 in order to obtain the further buried cavity structure 52 in the monocrystalline semiconductor substrate 10.

In the process of producing 220 the doped volume region 22 e.g. by means of an ion implantation process, for example the implantation dose, i.e. the implantation duration and the implantation energy, is then chosen so as to obtain a doping profile having a doping maximum at a target depth x1 for the further buried cavity structure 52 in the monocrystalline semiconductor substrate 10. The target depth can be at a distance or a depth of 0.01 to 30 μm, of 0.02 to 20 μm, of 0.05 to 10 μm or of (approximately) 1 to 5 μm, from the front side 10-1 of the monocrystalline semiconductor substrate 10.

Furthermore, the dopant concentration in the doped volume region 20 of the monocrystalline semiconductor substrate 10 can be chosen by means of the dopant implantation process so as to obtain for the first etchant a sufficient etching selectivity of the doped semiconductor material in the doped volume region in relation to the adjoining, undoped or more lightly doped semiconductor material of the monocrystalline semiconductor substrate 10. Typical dopings can be in a range of at least $10^{17}$ or at least $10^{18}$ cm$^{-3}$.

Phosphorus, for example, can be used as dopant in order to obtain a phosphorus doped silicon material in the doped volume region 20 of the monocrystalline semiconductor substrate 10. Alternative dopants can comprise aluminum, antimony, arsenic, boron, gallium, germanium, indium, carbon or nitrogen, etc.

In accordance with a further exemplary embodiment, oxygen $O_x$, for example, can also be used as dopant in order to obtain the buried, doped volume region 22 comprising a silicon oxide material $SiO_x$. As soon as for example the further buried cavity structure 52 has been obtained in the monocrystalline semiconductor substrate 10, the further buried cavity structure 52 can furthermore be "expanded" by the surface region of the buried cavity structure 52 obtained being oxidized and the silicon oxide material obtained subsequently being etched back in order to obtain a material removal within the buried cavity structure 52. This sequence of oxidizing and etching back in the buried cavity structure can be carried out or repeated as often as until a desired total material removal and hence the desired size of the buried cavity structure 52 is achieved.

Optionally, after producing 220 the doped volume region 22 comprising the doped semiconductor material in the monocrystalline semiconductor substrate 10, the monocrystalline semiconductor substrate 10 can furthermore be heat treated, i.e. subjected to a thermal treatment or an anneal, in order to crystalize out at least the doped volume region 22.

Step 230 of opening or forming the access opening 40 to the doped volume region 22 in the monocrystalline semiconductor substrate 10 can also be carried out by doping by means of ion implantation for example, a columnar volume region corresponding to the desired access opening 40 between the doped semiconductor region or volume region 20 and a surface region 10-1, 10-2 or 10-3 of the monocrystalline semiconductor substrate 10. In this case, this is also referred to, for example, as a column implantation for a columnar access opening 40. The access opening 40 to the doped volume region 22 can then in turn be formed for example by means of an etching process.

In this regard, in accordance with one exemplary embodiment, the doped semiconductor material of the access opening 40 to the doped volume region 22 and also the semiconductor material of the doped volume region 22 can be removed using the same etchant.

In accordance with a further exemplary embodiment, a second etchant can be used in the step of forming or etching 230 the access opening 40, wherein the doped volume region 22 of the monocrystalline semiconductor substrate 10 can then be effective for example as an etch stop layer for the second etchant. Afterward, the first etchant is then used for etching free the doped volume region 22 in the monocrystalline semiconductor substrate 10 through the access opening 40.

In the exemplary embodiments explained with reference to FIGS. 2A, 2B, and 2C, the etchants already described by way of example above in the case of the method 100 in FIG. 1 can be used as the first and respectively second etchant for the process of etching the doped volume region 22 and also the access opening 40.

As is illustrated in step 220 in FIG. 2A, a continuous doped volume region 22 can be produced in the monocrystalline semiconductor substrate 10. It is equally possible to produce a plurality of doped volume regions (not explicitly shown in FIGS. 2A, 2B, and 2C) spaced apart laterally and arranged e.g. parallel to the first main surface region 10-1 by means of a corresponding structuring of the doping mask 30 in the monocrystalline semiconductor substrate 10. Accordingly, in step 230, it is possible to produce respectively at least one access opening 40 to the differently doped volume regions 22 in the monocrystalline semiconductor substrate 10 in order then to remove the doped semiconductor material in the doped volume regions 22 using the first etchant through said access openings 40 in order to produce a plurality of buried cavity structures 52 lying in one plane, for example, in the monocrystalline semiconductor substrate 10.

In accordance with exemplary embodiments, the buried cavity structure 52 obtained in step 240 of removing the doped semiconductor material in the doped volume region 22 can thus be maintained as an unfilled cavity which can be effective for example for mechanical and/or electrical decoupling or stress decoupling or else as a fluid line (gas pipeline).

In an optional step 250 in FIG. 2C, a functional element or a functional structure 62 can then furthermore be introduced in the buried cavity structure or cavity 52, wherein introducing 250 the functional element involves again depositing e.g. conformally in the buried cavity structure 52 a layer or a layer sequence, e.g. by means of an ALD process (ALD=atomic layer deposition) and/or a CVD process (CVD=chemical vapor deposition). By applying a plurality of layers for the functional element 62, by way of example a layer stack composed of different materials can be obtained as the functional element 62, said layer stack at least partly or else completely filling the buried cavity 52. The functional element or the functional structure 62 can have an optical, electrical, electromagnetic, magnetic, etc. functionality or property.

Furthermore, it is possible, as described above, by means of various layer applying processes, to form one or more functional elements or functional structures 62 in the buried cavity structure 52 obtained or the buried cavity structures 52 obtained. The cavity 52 can thus be at least partly or completely filled with different materials. The functional element 62 can become effective for example as a buried reflector by a material having a high reflection index being applied in the buried cavity structure 52. Furthermore, buried metal contact lines or other electrical elements can be produced as the functional element 62 by means of corresponding layer applying processes in the buried cavity structure 52.

In an optional step 260 in FIG. 2C, a MEMS component 54 can then furthermore be formed in the monocrystalline semiconductor substrate 10 for example adjoining the first main surface region 10-1 above (relative to a perpendicular projection from the front side into the semiconductor substrate) the buried cavity structure(s) 52, said MEMS component being electrically and/or mechanically decoupled sufficiently well from the rest of the semiconductor material of the monocrystalline semiconductor substrate 10. Furthermore, at the front side 10-1 of the monocrystalline semiconductor substrate 10 which is not situated above (relative to a perpendicular projection from the front side into the semiconductor substrate) the buried cavity structure(s) 50, it is possible for example to form a circuit arrangement or an ASIC 56 which is in electrical contact e.g. with the MEMS component 54 and/or the functional element 62 in order to read from and/or drive the MEMS component and/or the functional element 60.

The optional step 260 can be carried out for example at any desired point in time in the process sequence of the method 200 after step 220 of producing the doped volume region 22 in the monocrystalline semiconductor substrate 10.

During the production of a sensor or MEMS component on a basic material carrier, such as e.g. a monocrystalline silicon wafer, an electrical and/or mechanical decoupling of different regions of the basic material carrier can thus be achieved in order to ensure a correct functionality of the sensor element arranged on the basic material carrier and of an electronic component electrically and/or mechanically decoupled therefrom, such as, for example, during a monolithic integration of different functional elements or semiconductor structures on the same basic material carrier, such as e.g. in the case of a MEMS sensor (MEMS=microelectromechanical system) with an ASIC control chip (ASIC=Application Specific Integrated Circuit).

The above described method 200 for producing one or more further buried cavity structures 52 in the epitaxially deposited semiconductor layer 10A of the monocrystalline semiconductor substrate 10 can be carried out repeatedly in order to form the buried cavity structures 52 in different planes of the resulting monocrystalline semiconductor substrate 10 additionally having the epitaxially deposited semiconductor layer(s) 10A. In this case, the buried cavity structures 52 can be arranged in different planes for example one above another (relative to a perpendicular projection from the front side 101 into the semiconductor substrate 10) or else in a manner laterally offset with respect to one another and can also have different functional elements 62.

Exemplary embodiments of the present disclosure are once again explained in summary below.

If it is assumed, for example, that silicon is used as material for the monocrystalline semiconductor substrate 10, it is possible to form hollow spaces or cavities 50, 52 in the silicon material 10 by obtaining a "targeted" material change, for example by implantation in the monocrystalline silicon material, which can also be referred to as carrier or basic material. Said targeted material change forms a buried silicon layer 20, 22 doped by means of implantation in the silicon substrate 10, wherein the doped silicon layer 20, 22 has an in-creased etching rate by comparison with the adjacent undoped or more lightly doped silicon material. The doped region 20, 22 is then connected, i.e. made accessible, by subsequent silicon hole etches and subsequently removed wet chemically.

By means of a resist mask 30 and with a predefined implantation dose, defined silicon regions 20, 22 are implanted at a specific depth in the monocrystalline silicon material 10. These implanted or doped silicon regions 20, 22 have an increased wet etching rate. Through an, e.g. lateral, access opening 40, finally, this doped, implanted silicon layer 20, 22 can be removed wet chemically and selectively with respect to the surrounding silicon material, such that cavities or cavity structures 50, 52 can be produced in a targeted manner in the monocrystalline silicon material 10. The access opening 40 can be obtained for example by carrying out e.g. a hole etch as far as the implanted silicon layer 20, 22, or by obtaining e.g. a vertical surface connection doped by means of implantation, which surface connection has an increased etching rate and can be etched free in a targeted manner.

In accordance with exemplary embodiments, one production variant can furthermore consist in implanting oxygen ($O_x$), wherein a subsequent anneal, i.e. an annealing process or a thermal treatment, leads to a buried silicon oxide layer ($SiO_x$ layer) 20, 22, which can subsequently be removed wet chemically, e.g. by means of HF (HF=hydrofluoric acid). In a further-reaching manner these cavities 50, 52 can be expanded by an alternation of a subsequent silicon oxidation and $SiO_x$ etching back thereof.

The buried cavity structures 50, 52 obtained in accordance with exemplary embodiments can remain as cavities in the monocrystalline silicon substrate or be filled with new materials in order to fulfill a further electrical, optical, electromagnetic, etc. functionality. This opens up a series of different fields of application for the buried cavity structures formed.

In accordance with exemplary embodiments, an implantation for positioning the cavities is thus fixed for example at the beginning of the process chain, but depleting or etching free the implanted silicon regions can take place only much later, e.g. after CMP processes that are often required, in the process chain. In this regard, mechanical stresses or thermal stresses are non-critical during the processing of the monocrystalline silicon substrate 10. In particular, what is achieved in accordance with exemplary embodiments is that with the implantation approach the silicon surface or silicon substrate surface remains planar above both doped and non-doped regions.

Additional exemplary embodiments and aspects of the invention are described which can be used individually or in combination with the features and functionalities described herein.

In accordance with a first aspect, a method 100, 200 for producing a buried cavity structure 50 can comprise the following steps: providing no a monocrystalline semiconductor substrate 10, producing 120 a doped volume region 20 in the monocrystalline semiconductor substrate 10 by means of a dopant implantation, wherein the doped volume region 20 has an increased etching rate for a first etchant by comparison with the adjoining, un-doped or more lightly doped material of the monocrystalline semiconductor substrate 10, forming 130 an access opening 40 to the doped volume region 20, and removing 140 the doped semiconductor material in the doped volume region 20 using the first etchant through the access opening 40 in order to obtain the buried cavity structure 50.

In accordance with a second aspect referring to the first aspect, the method 100, 200 can furthermore comprise the following steps after producing 120 the doped volume region 20: heat treating the monocrystalline semiconductor substrate 10 in order to crystalize out the doped volume region 30, epitaxially depositing 125 a monocrystalline semiconductor layer 10A on the first main surface region 10-1 of the monocrystalline semiconductor substrate 10 in order to obtain an increase in thickness with an additional monocrystalline semiconductor material at the first main surface region 10-1 of the monocrystalline semiconductor substrate 10, and forming 130 the access opening 40 to the doped volume region 20 through the monocrystalline semiconductor substrate 10 with the additional monocrystalline semiconductor material.

In accordance with a third aspect referring to the first aspect, the method 100, 200 can furthermore comprise the following steps: applying a doping mask 30 on a first main surface region 10-1 of the monocrystalline semiconductor substrate 10 and producing the doped volume region 20 in the monocrystalline semiconductor substrate 10 by means of the dopant implantation through the doping mask 30.

In accordance with a fourth aspect referring to the first aspect, in the method 100, 200 the implantation dose can be chosen so as to obtain a doping profile having a doping maximum at a target depth x1 for the buried cavity structure 50 in the monocrystalline semiconductor substrate.

In accordance with a fifth aspect referring to the first aspect, in the method 100, 200 the dopant concentration in the doped volume region 20 of the monocrystalline semiconductor substrate 10 can be chosen so as to obtain for the first etchant a sufficient etching selectivity with respect to the adjoining, undoped or more lightly doped semiconductor material.

In accordance with a sixth aspect referring to the first aspect, in the method 100, 200 phosphorus, aluminum, antimony, arsenic, boron, gallium, germanium, indium, carbon or nitrogen can be used as dopant in order to obtain the doped semiconductor material in the doped volume region 20.

In accordance with a seventh aspect referring to the first aspect, in the method 100, 200 the semiconductor material can comprise silicon, and oxygen $O_x$ can be used as dopant in order to obtain the buried volume region 30 comprising a silicon oxide material $SiO_x$.

In accordance with an eighth aspect referring to the seventh aspect, the method 100, 200 can furthermore comprise the following step: expanding the buried cavity structure 50 by repeating the following steps: oxidizing the surface region of the buried cavity structure obtained, and etching back the silicon oxide material obtained in order to achieve a material removal in the cavity structure.

In accordance with a ninth aspect referring to the first aspect, in the method 100, 200 the step of forming 130 the access opening 40 to the doped volume region 30 can comprise the following steps: doping a columnar volume region between the doped semiconductor region 30 and a main surface region 10-1, 10-2, 10-3 of the monocrystalline semiconductor substrate 10, and forming the access opening to the doped volume region.

In accordance with a tenth aspect referring to the first aspect, in the method 100, 200 the semiconductor material of the access opening 40 to the doped volume region 30 and the semiconductor material in the doped volume region 30 can be removed using the first etchant.

In accordance with an eleventh aspect referring to the ninth aspect, in the method 100, 200 a second etchant can be used in the step of forming 130 the access opening 40, wherein the doped volume region 30 of the monocrystalline semiconductor substrate 10 can be effective as an etch stop layer for the second etchant, and wherein furthermore the first etchant can be used for etching free the doped volume region 30 in the monocrystalline semiconductor substrate 10 through the access opening 40.

In accordance with a twelfth aspect referring to the first aspect, in the method at least one material of the present group of materials can be used as first etchant, wherein the group comprises $HNO_3$+HF, KOH, EDP, TMAH, SF6, $NF_3$, $Cl_2$, $CF_4$, HF, BOE, $NH_4F$ and CxFy.

In accordance with a thirteenth aspect referring to the first aspect, in the method the second etchant can comprise an etchant from the following group of etchants, wherein the group comprises SF6, $NF_3$, $Cl_2$ and $CF_4$.

In accordance with a fourteenth aspect referring to the first aspect, in the method 100, 200 the doped volume region 30 can comprise a plurality of separate doped volume regions 20, 22.

In accordance with a fifteenth aspect referring to the first aspect, the method 100, 200 can furthermore comprise the following step: introducing 150 a functional element 60 into the buried cavity structure 50, wherein introducing 150 the functional element 60 involves conformally depositing a layer or a layer sequence in the buried cavity structure 50.

In accordance with a sixteenth aspect referring to the fifteenth aspect, in the method 100, 200 a layer stack composed of different materials can be obtained by applying a plurality of layers, said layer stack at least partly filling the buried cavity structure 50.

In accordance with a seventeenth aspect referring to the fifteenth aspect, in the method 100, 200 the functional element 60 can have an optical, electrical and/or electromagnetic property.

In accordance with an eighteenth aspect referring to the first aspect, the method 200 can furthermore comprise the following step: after removing the doped semiconductor material in the doped volume region 30 in the monocrystalline semiconductor substrate 10, epitaxially depositing 210 a monocrystalline semiconductor layer on the first main surface region 10-1 of the monocrystalline semiconductor substrate 10 in order to obtain an increase in thickness with an additional monocrystalline semiconductor material at the first main surface region 10-1 of the monocrystalline semiconductor substrate 10.

In accordance with a nineteenth aspect referring to the eighteenth aspect, in the method 200 a further buried cavity structure 52 can be produced in the resulting monocrystalline semiconductor substrate 10, comprising the following steps: producing 220 a further doped volume region 22 in the epitaxially deposited monocrystalline semiconductor substrate material 12 by means of a further dopant implantation, wherein the further doped volume region 22 has for the first etchant an increased etching rate by comparison with the adjoining, undoped or more lightly doped material of the monocrystalline semiconductor substrate, opening 230 an access opening 40 to the further doped volume region 22, and removing 240 the doped semiconductor material in the further doped volume region 22 using the first etchant through the access opening 40 in order to obtain the further buried cavity structure 52 in the resulting monocrystalline semiconductor substrate 10.

In accordance with a twentieth aspect referring to the nineteenth aspect, the method 200 can furthermore comprise the following steps: applying a doping mask 30 on the first main surface region 101 of the monocrystalline semiconductor substrate 10, and producing the further doped volume region 22 in the monocrystalline semiconductor substrate 10 by means of the further dopant implantation through the further doping mask 30.

In accordance with a twenty first aspect referring to the nineteenth aspect, the method 200 can furthermore comprise the following step: introducing 250 a further functional element 62 into the buried cavity structure 52, wherein introducing 250 the further functional element 62 involves conformally depositing a layer or a layer sequence in the buried cavity structure 52. In accordance with a twenty second aspect referring to the first aspect, the method 100, 200 can furthermore comprise the following step: forming 260 a MEMS component in the monocrystalline semiconductor substrate 10 adjoining the first main surface region 101 above the buried cavity structure 50, 52. Although some aspects have been described in connection with a method for producing a buried cavity structure in a monocrystalline semiconductor substrate, it goes without saying that these aspects also constitute a description of the corresponding device for producing a buried cavity structure in a monocrystalline semiconductor substrate, such that a method step or a feature of a method step should also be understood as a corresponding block or a component of a corresponding device. Some or all of the method steps can be carried out by a hardware apparatus (or using a hardware apparatus), such as using a microprocessor, a programmable computer or an electronic circuit. In some exemplary embodiments, some or a plurality of the most important method steps can be performed by such an apparatus.

The exemplary embodiments described above constitute merely an illustration of the principles of the present exemplary embodiments. It goes without saying that modifications and variations of the arrangements and details described herein will be apparent to others skilled in the art. Therefore, the intension is for the exemplary embodiments to be restricted only by the scope of protection of the following patent claims and not by the specific details that have been presented on the basis of the description and the explanation of the exemplary embodiments herein.

What is claimed is:

1. A method for producing a buried cavity structure, the method comprising:
   providing a monocrystalline semiconductor substrate,
   producing a doped volume region in the monocrystalline semiconductor substrate by performing a dopant implantation, wherein the doped volume region has an increased etching rate for a first etchant by comparison with an adjoining, undoped or more lightly doped material of the monocrystalline semiconductor substrate,
   forming an access opening to the doped volume region,
   removing doped semiconductor material from the doped volume region using the first etchant through the access opening to obtain the buried cavity structure, and
   after removing the doped semiconductor material from the doped volume region, epitaxially depositing a monocrystalline semiconductor layer on a first main surface region of the monocrystalline semiconductor substrate to obtain an increase in thickness with an additional monocrystalline semiconductor material at the first main surface region of the monocrystalline semiconductor substrate.

2. The method as claimed in claim 1, further comprising performing the following steps after producing the doped volume region:
   heat treating the monocrystalline semiconductor substrate to crystalize out the doped volume region.

3. The method as claimed in claim 1, further comprising:
   applying a doping mask on the first main surface region of the monocrystalline semiconductor substrate and
   producing the doped volume region in the monocrystalline semiconductor substrate by performing the dopant implantation through the doping mask.

4. The method as claimed in claim 1, wherein an implantation dose is chosen so as to obtain a doping profile having a doping maximum at a target depth for the buried cavity structure in the monocrystalline semiconductor substrate.

5. The method as claimed in claim 1, wherein a dopant concentration in the doped volume region of the monocrystalline semiconductor substrate is chosen to obtain for the first etchant a sufficient etching selectivity with respect to the adjoining, undoped or more lightly doped semiconductor material.

6. The method as claimed in claim 1, wherein phosphorus, aluminum, antimony, arsenic, boron, gallium, germanium, indium, carbon or nitrogen is used as dopant to obtain the doped semiconductor material in the doped volume region.

7. The method as claimed in claim 1, wherein the monocrystalline semiconductor substrate comprises silicon, and wherein oxygen Ox is used as a dopant to obtain a buried volume region comprising a silicon oxide material SiOx.

8. The method as claimed in claim 1, wherein the doped volume region comprises a plurality of separate doped volume regions.

9. The method as claimed in claim 1, further comprising:
   introducing a functional element into the buried cavity structure, wherein introducing the functional element comprises conformally depositing a layer or a layer sequence in the buried cavity structure.

10. The method as claimed in claim 9, wherein a layer stack composed of different materials is obtained by applying a plurality of layers, said layer stack at least partly filling the buried cavity structure.

11. The method as claimed in claim 9, wherein the functional element comprises an optical, electrical and/or electromagnetic property.

12. The method as claimed in claim 1, further comprising producing a further buried cavity structure in the monocrystalline semiconductor layer, producing the further buried cavity structure comprising:
   producing a further doped volume region in the epitaxially deposited monocrystalline semiconductor layer by performing a further dopant implantation, wherein the further doped volume region has for the first etchant an increased etching rate by comparison with the adjoining, undoped or more lightly doped material of the monocrystalline semiconductor layer,
   opening an additional access opening to the further doped volume region, and
   removing doped semiconductor material in the further doped volume region using the first etchant through the additional access opening to obtain the further buried cavity structure in the monocrystalline semiconductor layer.

13. The method as claimed in claim 12, further comprising:
   applying a further doping mask on the additional monocrystalline semiconductor material at the first main surface region of the monocrystalline semiconductor layer, and
   producing the further doped volume region in the monocrystalline semiconductor substrate by performing the further dopant implantation through the further doping mask.

14. The method as claimed in claim 12, further comprising:
   introducing a further functional element into the further buried cavity structure, wherein introducing the further functional element comprises conformally depositing a layer or a layer sequence in the further buried cavity structure.

15. The method as claimed in claim 1, further comprising forming a MEMS component in the monocrystalline semiconductor substrate adjoining the first main surface region of the monocrystalline semiconductor substrate above the buried cavity structure.

16. A method for producing a buried cavity structure, the method comprising:
   providing a monocrystalline semiconductor substrate,
      producing a doped volume region in the monocrystalline semiconductor substrate by performing a dopant implantation, wherein the doped volume region has an increased etching rate for a first etchant by comparison with an adjoining, undoped or more lightly doped material of the monocrystalline semiconductor substrate,
   forming an access opening to the doped volume region,
      removing doped semiconductor material from the doped volume region using the first etchant through the access opening to obtain the buried cavity structure, and
      expanding the buried cavity structure by repeating the following steps:
      oxidizing a surface region of the buried cavity structure obtained, and
      etching back the oxidized surface region obtained to achieve a material removal in the buried cavity structure.

17. A method for producing a buried cavity structure, the method comprising:
   providing a monocrystalline semiconductor substrate,
   producing a doped volume region in the monocrystalline semiconductor substrate by performing a dopant implantation, wherein the doped volume region has an increased etching rate for a first etchant by comparison with an adjoining, undoped or more lightly doped material of the monocrystalline semiconductor substrate, forming an access opening to the doped volume region, wherein forming the access opening to the doped volume region comprises:

doping a columnar volume region between the doped volume region and a main surface region of the monocrystalline semiconductor substrate, forming the access opening to the doped volume region, and removing doped semiconductor material from the doped volume region using the first etchant through the access opening to obtain the buried cavity structure.

18. The method as claimed in claim 17, wherein a second etchant is used in the step of forming the access opening, wherein the doped volume region of the monocrystalline semiconductor substrate is effective as an etch stop layer for the second etchant, and wherein furthermore the first etchant is used for etching free the doped volume region in the monocrystalline semiconductor substrate through the access opening.

19. The method as claimed in claim 18, wherein the first etchant comprises at least one of $HNO_3$+HF, KOH, EDP, TMAH, SF6, $NF_3$, $Cl_2$, $CF_4$, HF, BOE, $NH_4F$ or CxFy.

20. The method as claimed in claim 18, wherein the second etchant comprises at least one of SF6, $NF_3$, $Cl_2$ or $CF_4$.

21. A method comprising:

implanting dopants in a monocrystalline semiconductor substrate to form a doped volume region below a first surface of the monocrystalline semiconductor substrate;

forming an access opening to the doped volume region;

forming a buried cavity in the monocrystalline semiconductor substrate by etching the monocrystalline semiconductor substrate using a first etchant to remove doped semiconductor material from the doped volume region via the access opening, wherein the first etchant etches the doped volume region at a higher etching rate than portions of the monocrystalline semiconductor substrate surrounding the doped volume region, and at least a majority of a volume of the buried cavity is covered by a first portion of the monocrystalline semiconductor substrate disposed below the first surface; and expanding the buried cavity by repeating the following steps:

oxidizing a surface region of the buried cavity, and etching back the oxidized surface region obtained to achieve a material removal in the buried cavity.

22. The method of claim 21, further comprising forming a MEMS component in the first portion of the monocrystalline semiconductor substrate that covers the buried cavity.

* * * * *